(12) United States Patent
Wang et al.

(10) Patent No.: US 12,028,015 B2
(45) Date of Patent: **\*Jul. 2, 2024**

(54) BEAM AND USE THEREOF AND SOLAR TRACKING BRACKET

(71) Applicant: Arctech Solar Holding Co., Ltd., Jiangsu (CN)

(72) Inventors: Shitao Wang, Jiangsu (CN); Pengxiao Yu, Jiangsu (CN)

(73) Assignee: Arctech Solar Holding Co., Ltd., Jiangsu (CN)

( * ) Notice: Subject to any disclaimer, the term of this patent is extended or adjusted under 35 U.S.C. 154(b) by 490 days.

This patent is subject to a terminal disclaimer.

(21) Appl. No.: 17/392,698

(22) Filed: Aug. 3, 2021

(65) Prior Publication Data
US 2021/0367550 A1    Nov. 25, 2021

Related U.S. Application Data

(63) Continuation-in-part of application No. PCT/CN2020/072881, filed on Jan. 17, 2020.

(30) Foreign Application Priority Data

Feb. 28, 2019  (CN) .......................... 201910147811.7
Jul. 5, 2021  (CN) .......................... 202121515394.6

(51) Int. Cl.
*H02S 20/32* (2014.01)
*H01L 31/068* (2012.01)

(52) U.S. Cl.
CPC .......... *H02S 20/32* (2014.12); *H01L 31/0684* (2013.01)

(58) Field of Classification Search
CPC ..... H01L 31/0684; H02S 20/32; H02S 30/10; F24S 30/40; F24S 25/60; F24S 25/00; F24S 25/70
See application file for complete search history.

(56) References Cited

U.S. PATENT DOCUMENTS 7,647,924 B2 * 1/2010 Hayden .................. F24S 25/10
                                                   40/607.01
10,305,418 B2 * 5/2019 Bapat ..................... H02S 20/23
(Continued)

*Primary Examiner* — Alfred Basichas
(74) *Attorney, Agent, or Firm* — Chambliss, Bahner & Stophel, P.C.; Stephen D. Adams

(57) ABSTRACT

A beam includes a flat plate and an elliptical curved plate, each of both ends of the flat plate are respectively fixedly connected to a corresponding end of the elliptical curved plate to form a ring shape, and a plane where the flat plate is located is perpendicular to a long axis of an ellipse where the elliptical curved plate is located. Also provided is the use of the beam in a solar tracking bracket that includes the beam; a post; and a bearing seat comprising a bearing ring, a Z-shaped support plate and a bottom plate connected sequentially. The Z-shaped support plate has a Z-shaped cross section, the beam is installed inside the bearing ring, the flat plate of the beam faces a solar module, and the bottom plate is connected to the post. The beam of the present invention improves the resistance moment of the lateral cross section and saves costs, and when applied to the solar tracking bracket, the beam can slow down the hot spot effect of the bifacial solar module and prolong the service life of the same.

16 Claims, 10 Drawing Sheets

(56) References Cited

U.S. PATENT DOCUMENTS

| | | | | |
|---|---|---|---|---|
| 2010/0307991 | A1* | 12/2010 | Belikoff | H01L 31/042 211/41.17 |
| 2013/0269752 | A1* | 10/2013 | Corio | F24S 25/10 136/246 |
| 2014/0290716 | A1* | 10/2014 | Stubbs | H02S 20/00 136/251 |
| 2018/0347859 | A1* | 12/2018 | Ros Ruiz | F16B 7/0486 |

* cited by examiner

BEAM AND USE THEREOF AND SOLAR TRACKING BRACKET

CROSS-REFERENCES TO RELATED APPLICATIONS

The present invention is a continuation-in-part application to PCT Patent Application No. PCT/CN2020/072881, entitled "MAIN BEAM AND APPLICATION THEREOF, AND PHOTOVOLTAIC TRACKING SUPPORT", filed on Jan. 17, 2020, which claims priority to Chinese Patent Application No. 201910147811.7, filed on Feb. 28, 2019, and Chinese Patent Application No. 202121515394.6, filed on Jul. 5, 2021, and the applications are commonly owned and incorporated by reference herein for all purposes.

TECHNICAL FIELD

The invention relates to a field of structural design of a solar tracking support, and in particular to a beam and a use thereof and a solar tracking bracket.

BACKGROUND

In the prior art, solar power generation has become a trend and is widely used in various places. Solar power generation is based on a principle of photovoltaic effect to directly convert solar energy into electrical energy. Regardless of whether it is used independently or connected to a grid, a solar power generation system mainly consists of three parts: a solar module, a controller and an inverter. In order to ensure that the solar module maintains high power generation efficiency, a solar tracking bracket has been developed, in which a solar module is installed on a beam, and the beam drives the solar module to rotate with the movement of the sun.

The beam of the solar tracking bracket is required to have a certain bending strength. The U.S. Pat. No. 7,647,924B2 entitled "SYSTEM FOR SUPPORTING ENERGY CONVERSION MODULES" discloses a beam consisting of a circular curved plate and a flat plate. The bending strength of the beam has been partially improved, however, in order to achieve the same strength and rigidity of the beam, its weight is still relatively large, and its cost accounts for a large part of that of the solar tracking bracket, resulting in a tremendous cost of the solar tracking bracket.

SUMMARY

An object of the invention is to provide a beam and a use thereof and a solar tracking bracket, wherein the beam has an improved resistance moment of a lateral cross section, a lighter weight and a reduced cost. Upon application of the above beam, in addition to the aforementioned technical effects, the solar tracking bracket is more evenly stressed, and its installation is more convenient and faster.

The technical solutions provided by the invention are as follows: a beam, including: a flat plate and an elliptical curved plate, each of both ends of the flat plate being respectively fixedly connected to a corresponding end of the elliptical curved plate to form a ring shape, and a plane where the flat plate is located being perpendicular to a long axis of an ellipse where the elliptical curved plate is located.

Benefiting from the above structure, when the beam is applied to a solar tracking bracket, due to the special shape of the beam, the resistance moment of the lateral cross section of the beam can be improved by sacrificing less torsion resistance. Compared with the arc D-shaped beam in the prior art, on the basis of ensuring the same thickness, the resistance moment of the lateral cross section can be increased by 5.14%, and steel material can be saved by 0.04% per meter, which has good practical application value.

Preferably, a transition section is provided between the flat plate and the elliptical curved plate, and an outer surface of the transition section is smooth.

The flat plate is connected to the elliptical curved plate through the transition section, so as to avoid occurrence of a sharp joint between the flat plate and the elliptical curved plate, which is prone to scratch the staff.

Preferably, a reflective layer is provided on an outer surface of the flat plate and/or the transition section.

When a bifacial solar module is installed on the beam, since a part of the bifacial solar module will be shielded by the beam and cannot be irradiated by light, the shielded part of the bifacial solar module will act as a load to consume the energy generated by the other irradiated part of the bifacial solar module. At this time, the shielded part of the bifacial solar module will generate heat, causing a hot spot effect that seriously shortens the life time of the bifacial solar module. The present structure reflects light to the shielded part of the bifacial solar module via the reflective layer, so as to reduce generation of the hot spot effect and prolong the life time of the bifacial solar module.

Also provided is a use of the beam in a solar tracking bracket installed with a bifacial solar module.

A beam, including: a flat plate and a curved plate, each of both ends of the flat plate being respectively fixedly connected to a corresponding end of the curved plate, the beam forming a ring shape, and a length L1 of the curved plate in cross section is greater than or equal to 76% of a circumference L2 of the beam in cross section.

Preferably, the curved plate has an arc shape or an elliptical curved shape.

Preferably, the flat plate includes a main plate and two lateral plates located on both sides of the main plate, two side ends of the main plate are respectively connected to the two lateral plates, the two lateral plates are perpendicular to the main plate, two free ends of the curved plate are respectively and correspondingly connected to the two lateral plates, and a length of the main plate in cross section is smaller than a maximum chord length of the curved plate in cross section.

A beam, wherein the beam includes a flat plate and a curved plate, the flat plate includes a main plate and two lateral plates located on both sides of the main plate, two side ends of the main plate are respectively connected to the two lateral plates, the two lateral plates are perpendicular to the main plate, the curved plate is located on an opposite side to the flat plate, two free ends of the curved plate are respectively and correspondingly connected to the two lateral plates, such that the beam forms a circumferentially enclosed piping component; the beam has a rotation center, and two connecting lines between the two free ends of the curved plate and the rotation center form an included angle A, where 120 degrees≤A≤180 degrees.

Preferably, the length of the main plate in cross section is equal to the maximum chord length of the curved plate in cross section.

A solar tracking bracket with the aforementioned beam, further including: a post; and a bearing seat including a bearing ring, a Z-shaped support plate and a bottom plate connected sequentially from top to bottom, the Z-shaped support plate having a Z-shaped cross section in a horizontal direction, the beam being installed inside the bearing ring, the flat plate of the beam facing the solar module, and the bottom plate being connected to the post.

Benefiting from the above structure, since the Z-shaped support plate is used to fix the bearing ring, compared to the C-shaped support structure used to fix the bearing ring in the prior art, the Z-shaped support plate is more evenly stressed and thus can carry a larger load.

Preferably, the solar tracking bracket further including: a post top column including a first connecting plate, wherein both ends of the first connecting plate extend towards the post to form a second connecting plate, the second connecting plate is connected to the post, the first connecting plate is perforated with a first horizontal adjustment waist hole, the bottom plate is perforated with a second horizontal adjustment waist hole corresponding to the first horizontal adjustment waist hole, the first horizontal adjustment waist hole and the second horizontal adjustment waist hole are locked via a bolt, a long axis of the first horizontal adjustment waist hole and a long axis of the second horizontal adjustment waist hole are perpendicular to each other, and the long axis of the first horizontal adjustment waist hole is parallel to an extension direction of the beam, or the long axis of the first horizontal adjustment waist hole is perpendicular to the extension direction of the beam.

When adjusting the position or angle of the beam, loosen the bolt, and then make position adjustment of the beam in its own axial direction and/or in a direction perpendicular to its axial direction through cooperation of the first horizontal adjustment waist hole and the second horizontal adjustment waist hole, or make angle adjustment of the beam on the horizontal plane by rotating the beam. Finally, tighten the bolt to fix the beam.

Preferably, two of the first horizontal adjustment waist holes are provided and symmetrical about a center of the first connecting plate, two of the second horizontal adjustment waist holes are provided and symmetrical about a center of the bottom plate.

Through respective provision of two of the first horizontal adjustment waist holes and two of the second horizontal adjustment waist holes, since they are respectively symmetrical about the center of the first connecting plate and the center of the bottom plate, when making angle adjustment of the beam by rotating the bottom plate, the bottom plate can rotate around its own center, such that the angle adjustment of the beam can be more accurate.

Preferably, each of the second connecting plates is provided with a vertical adjustment waist hole and a vertical fixing hole, the post is provided with a post adjustment waist hole corresponding to the vertical adjustment waist hole, the post is provided with a post fixing hole corresponding to the vertical fixing hole, a long axis of the vertical adjustment waist hole and a long axis of the post adjustment waist hole are perpendicular to each other, the post adjustment waist hole and the vertical adjustment waist hole are fastened via a bolt, the post fixing hole and the vertical fixing hole are fastened via a bolt.

Benefiting from the above structure, by adjusting the positions of the vertical adjustment waist hole and the post adjustment waist hole, the angle adjustment of the post top column in the height direction can be made, and its rotation center is the center of the vertical fixing hole.

Preferably, a first end of the beam is a shrinkable section formed by extruding the first end of the beam, an inner surface of the shrinkable section is welded or riveted with a locking nut; the shrinkable section of the beam extends into a second end of an adjacent beam, a locking bolt sequentially passes through the second end of the adjacent beam and the shrinkable section of the beam and is fastened by screwing to a corresponding locking nut.

Benefiting from the above structure, adjacent beams are connected. Compared with the method of connecting via a connecting plate in the prior art, which uses more bolts and has slow installation speed, in the present structure, since the locking nut is pre-arranged on the inner surface of the shrinkable section, it is merely necessary to tighten the locking bolt and the corresponding locking nut. The installation speed is faster, and no additional connecting plate is needed, which saves costs.

Preferably, a plurality of locking nuts are provided and are evenly arranged on the inner surface of the shrinkable section of the beam, the locking nuts and the locking bolts are provided in one-to-one correspondence.

Adjacent beams are connected via a plurality of evenly arranged locking nuts, making connection between each other stronger.

The beam and the use thereof and the solar tracking bracket as provided by the invention can bring the following beneficial effects: on the basis of ensuring the same thickness, the present beam has better resistance moment of the lateral cross section and lighter weight. Compared with the prior art, the resistance moment of the lateral cross section can be increased by 5.14%, and steel material can be saved by 0.04% per meter. When the present beam is applied to the solar tracking bracket, the beam can reflect light to the shielded part of the bifacial solar module, thereby reducing the hot spot effect on the bifacial solar module and prolonging life time of the bifacial solar module. Meanwhile, since the Z-shaped support plate is used to support the bearing ring, when compared with the support structure with a C-shaped cross section in the prior art, the Z-shaped support plate is stressed more evenly, so that the load capacity of the Z-shaped support plate is improved.

BRIEF DESCRIPTION OF THE DRAWINGS

Hereinafter, preferred embodiments will be described in a clear and easy-to-understand manner with reference to the accompanying drawings, and the above characteristics, technical features, advantages and implementations of the beam and the use thereof and the solar tracking bracket will be further illustrated.

DESCRIPTION OF REFERENCE NUMERALS

1—beam, 1a—shrinkable section, 1b—first connecting hole, 1c—second connecting hole, 1d—flat plate, 1e—transition section, 1f—elliptical curved plate, 2a—locking nut, 2b—locking bolt, 3—post, 4a—first connecting plate, 4b—second connecting plate, 4c—first horizontal adjustment waist hole, 4d—vertical adjustment waist hole, 4e—vertical fixing hole, 5—bottom plate, 5a—second horizontal adjustment waist hole, 6—Z—shaped support plate, 7—bearing ring, 11d—main plate, 12d—lateral plate, 11f, 12f—free ends, 13d—rotation center, A—included angle, T—maximum chord length.

DETAILED DESCRIPTION OF THE EMBODIMENTS

In order to illustrate examples of the invention or technical solutions in the prior art more clearly, specific embodiments of the invention will be described below with reference to the drawings. Obviously, the drawings in the following description are merely some examples of the invention. For those of ordinary skill in the art, other drawings and embodiments can be obtained based on these drawings without creative work.

In order to make the drawings concise, each of them only schematically shows the parts related to the invention, and they do not represent the actual structure as a product.

Example 1

Figure 1:
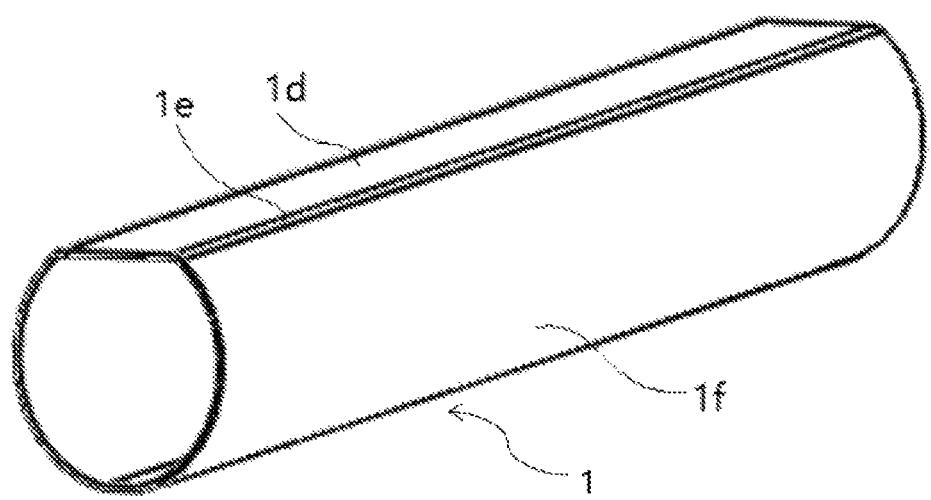
FIG. 1 is a perspective view of a beam.
Figure 2:
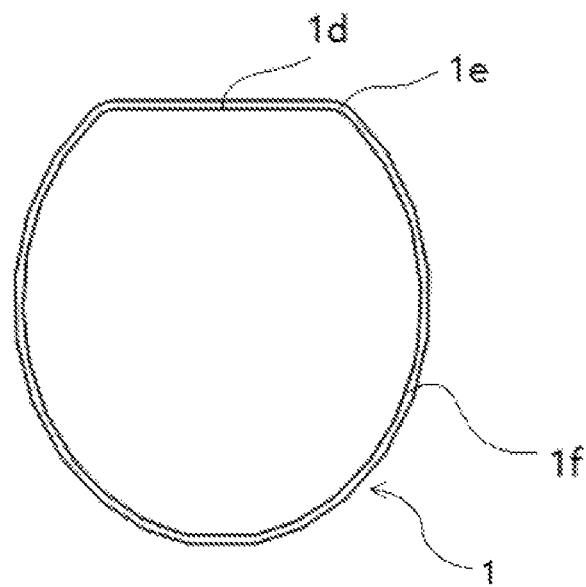
FIG. 2 is a cross-sectional view of a beam.

As shown in FIGS. 1-2, example 1 discloses a specific embodiment of a beam, which specifically includes: a flat plate 1d and an elliptical curved plate 1f, each of both ends of the flat plate 1d is respectively fixedly connected to a corresponding end of the elliptical curved plate 1f to form a ring shape, and a plane where the flat plate 1d is located is perpendicular to a long axis of an ellipse where the elliptical curved plate 1f is located. In order to smoothly transition between the flat plate 1d and the elliptical curved plate 1f, a transition section 1e is provided between the flat plate 1d and the elliptical curved plate 1f, and an outer surface of the transition section 1e is smooth.

When the beam 1 is installed on the solar tracking support, the beam 1 is used for bending resistance test and the weight per unit length is calculated. The specific data are listed in Table 1 below.

TABLE 1

|  | Arc D-Shaped Beam | Beam 1 | (Beam 1 − Arc D-Shaped Beam)/Arc D-Shaped Beam |
| --- | --- | --- | --- |
| Thickness/mm | 4 | 4 | 0 |
| Resistance Moment of the Lateral Cross Section $M_x$/mm³ | 46340 | 48720 | 5.14% |
| Weight per Length/(kg/m) | 12.451 | 12.446 | −0.04% |

The arc D-shaped beam mentioned in U.S. Pat. No. 7,647,924B2 in the Background was installed on the solar tracking bracket, so that the arc D-shaped beam had the same thickness as the beam 1 of the present example. As measured in the test, the resistance moment of the lateral cross section of the arc D-shaped beam is 46340/mm3, and the weight per length is 12.451 kg. Comparing with the data shown in Table 1, it can be seen that for beam 1 of the present example, on the basis of ensuring the same thickness, the resistance moment of the lateral cross section can be increased by 5.14%, and the cost is saved by about 0.04%.

Example 2

Figure 11:
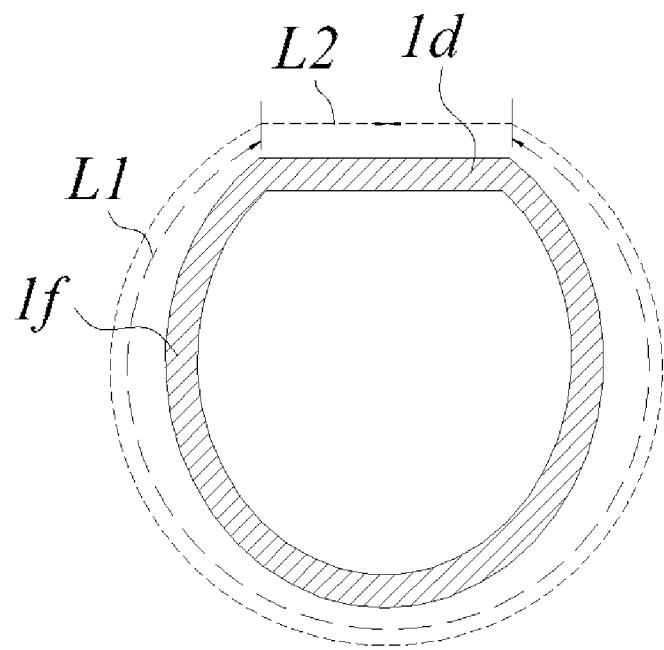
FIG. 11 is a cross-sectional view of a further beam with an arc plate.
Figure 12:
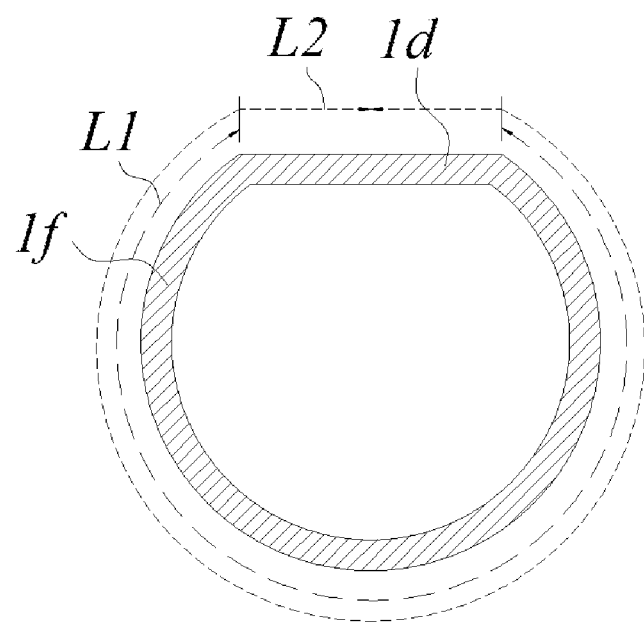
FIG. 12 is a cross-sectional view of a further beam with an elliptical curved plate.

As shown in FIGS. 11-12, example 2 discloses a specific embodiment of a beam including a flat plate 1d and a curved plate 1f, each of both ends of the flat plate 1d is respectively fixedly connected to a corresponding end of the curved plate 1f to form a ring shape, and a length L1 of the curved plate in cross section is greater than or equal to 76% of a circumference L2 of the beam in cross section. In this way, the beam can rotate smoothly without jamming, and the bearing is evenly stressed, thereby increasing the service life. At the same time, better torsion resistance is provided, and the flat plate 1f having this corresponding size can provide a sufficient installation plane. In order to have a smooth transition between the flat plate 1d and the elliptical curved plate 1f, a transition section is provided between the flat plate 1d and the elliptical curved plate 1f, and an outer surface of the transition section is smooth.

In this embodiment, the elliptical curved plate 1f may have an arc shape or an elliptical curved shape.

Figure 13:
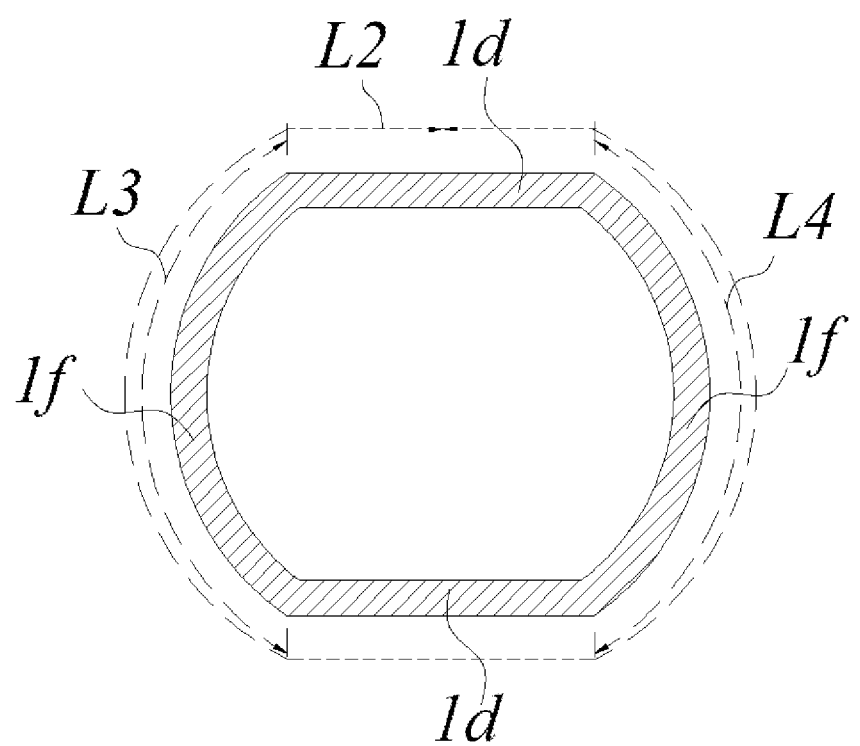
FIG. 13 is a cross-sectional view of a further beam having a centrally symmetric ring shape.

As shown in FIG. 13, in this embodiment, the beam may also have a centrally symmetric ring shape in cross section with two flat plates 1d and two curved plates 1f. At this time, the curved plate has a length L1=L3+L4 in cross section.

Example 3

Figure 14:
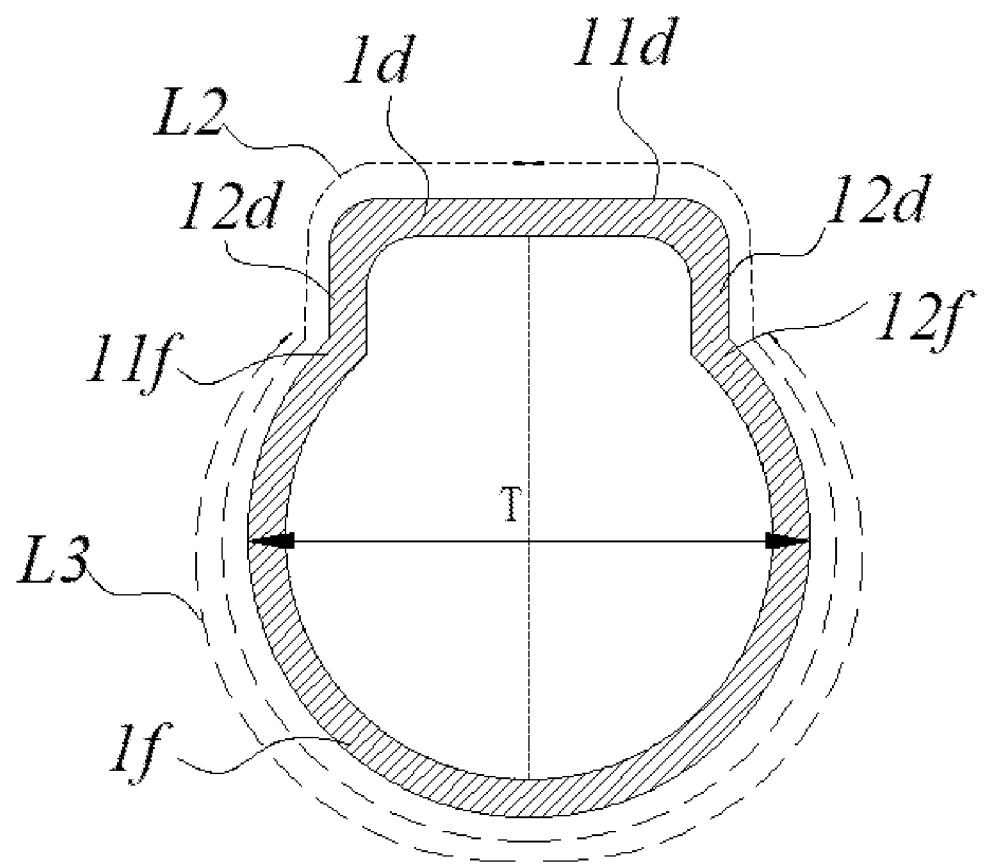
FIG. 14 is a cross-sectional view of a further beam with an arc plate.

As shown in FIG. 14, the only difference between example 3 and example 2 is the structure of the flat plate 1d. The flat plate 1d includes a main plate 11d and two lateral plates 12d located on both sides of the main plate 11d, two side ends of the main plate 11d are respectively connected to the two lateral plates 12d, the two lateral plates 12d are perpendicular to the main plate 11d. The curved plate 1f is located on an opposite side to the flat plate 1d, two free ends (11f, 12f) of the curved plate 1f are respectively and correspondingly connected to the two lateral plates 12d, such that the beam forms a circumferentially enclosed piping component. A length L of the main plate 11d in cross section is smaller than a maximum chord length T of the curved plate 1f in cross section. In this way, by increasing the arc length of the curved plate 1f, the beam may rotate smoothly without jamming, and the bearing is evenly stressed. At the same time, the beam has better torsion resistance and bending resistance, which improves the utilization rate of materials and reduces the cost. In this embodiment, a perimeter L2 of the beam in the cross section is the sum of the lengths of the main plate 11d, the two side plates 12d and the curved plate 1f.

Example 4

Figure 15:
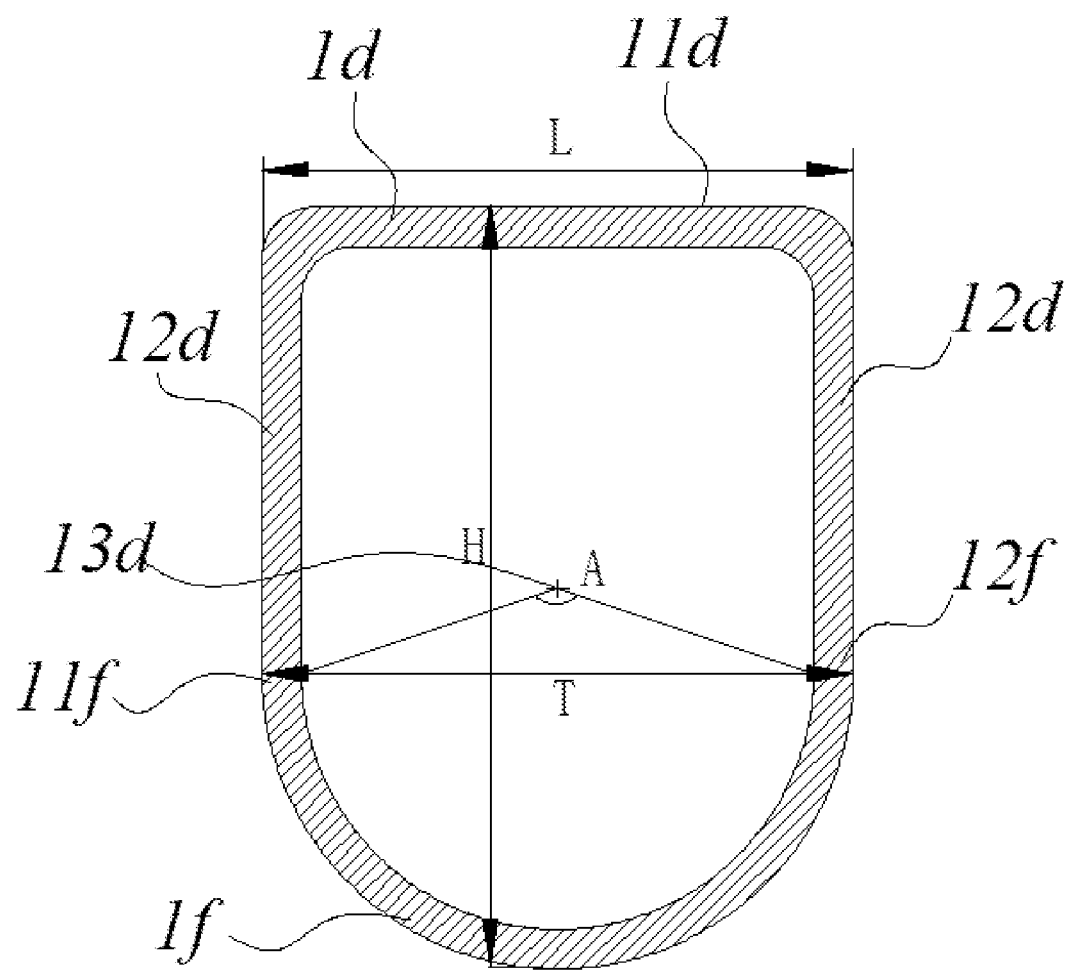
FIG. 15 is a cross-sectional view of a further beam with an arc plate.

As shown in FIG. 15, example 4 discloses a specific embodiment of a further beam. The beam includes a flat plate 1d and a curved plate 1f, the flat plate 1d includes a main plate 11d and two lateral plates 12d located on both sides of the main plate 11d, two side ends of the main plate 11d are respectively connected to the two lateral plates 12d, and the two lateral plates 12d are perpendicular to the main plate 11d. The curved plate 1f is located on an opposite side to the flat plate 1d, and two free ends (11f, 120 of the curved plate 1f are respectively and correspondingly connected to the two lateral plates 12d, such that the beam forms a circumferentially enclosed piping component. Generally, there is a smooth transition between the main plate 11d and the two lateral plates 12d.

The beam has a rotation center 13d. Preferably, the rotation center 13d is located in an area enclosed by the main plate 11d and the two lateral plates 12d, that is, the rotation center 13d is located on an opposite side to the curved plate 1f. The specific position of the rotation center 13d can be determined according to design calculations, experiments or simulations. Two connecting lines between the two free ends (11f, 120 of the curved plate 1f and the rotation center 13d form an included angle A, where 100 degrees≤A≤180 degrees. When the included angle A<100 degrees, the beam is applied to the solar tracking bracket. Generally, the rotation limit angle of the solar tracking bracket supporting the solar module is within ±50 degrees. The included angle A<100 degrees indicates that during rotation of the solar tracking bracket, friction occurs between part of the non-arc area of the main beam and the plastic bearing, which will impart eccentric force to the plastic bearing and result in an eccentricity of the beam. In addition, it will also accelerate the friction on the plastic bearing and reduce the life of the plastic bearing. The included angle A>180 degrees indicates that the height H of the entire beam is reduced, and under the same load condition of the beam, the bending resistance of the beam is reduced.

In this embodiment, the included angle A is preferably 120 degrees. In other embodiments, the included angle A can also be 100 degrees or 110 degrees.

Preferably, the length L of the main plate 11d in cross section is equal to the maximum chord length T of the curved plate 1f in cross section, such that the flat plate has the longest installation face, which helps to firmly fix a purline. Here, the maximum chord length T is the maximum distance formed by intersection of a straight line perpendicular to the vertical line of the main plate 11d and the curved plate 1f.

Example 5

As shown in FIGS. 1-2, example 5 is based on examples 1-4. In example 5, a reflective layer is provided on an outer surface of the flat plate 1d and the transition section 1e. The reflective layer is formed by coating reflective material or wrapping tin foil paper. In the present example, the reflective material is metal spray paint. In other specific example, the reflective material can also be white paint, luminescent film, etc., which will not be repeated herein.

When the beam 1 is installed on the solar tracking bracket, the flat plate 1d is facing the bifacial solar module, and light is reflected by the reflective layer to the part of the bifacial solar module that is shielded by the beam 1, thereby reducing the hot spot effect. In areas with different irradiation resources, the life time of the bifacial solar module can still be maintained for 25 years. The beam 1 in example 1 is installed on the solar tracking bracket. In areas with good radiation resources, the bifacial solar module may fail due to the hot spot effect in the shielded area on the back, so that the life time of the bifacial solar module is greatly reduced.

Further, in order to achieve diffuse reflection at the flat plate 1d and the transition section 1e, so that the shielded part of the bifacial solar module receives more uniform light, the outer surfaces of the flat plate 1d and the transition section 1e are designed to be rough, and then the reflective layer is laid on the rough outer surfaces, that is to say, the reflective surface is a diffuse reflective surface. Therefore, when light irradiates the reflective layer, since the reflective layer is uneven, diffuse reflection is formed.

Of course, the outer surface of the separate flat plate 1d or the outer surface of the separate transition section 1e can also have a reflective layer, which can reflect light to a certain extent on the shielded part of the bifacial solar module, thereby reducing the hot spot effect, which will not be repeated herein.

Example 6

As shown in FIGS. 1-6 and 8-10, example 6 discloses a specific embodiment of a solar tracking bracket. In addition to any one of the beams 1 in examples 1-5, the solar tracking bracket also includes a post 3 and a bearing seat.

Figure 8:
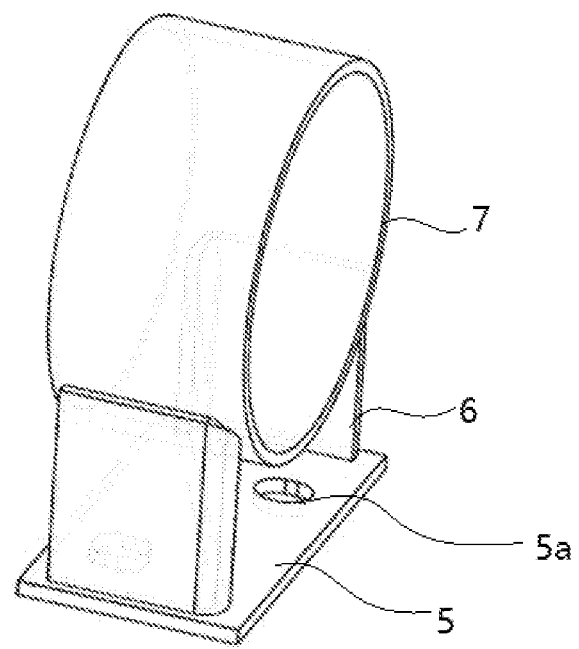
FIG. 8 is a perspective view of a bearing seat.

As shown in FIG. 8, the bearing seat includes a bearing ring 7, a Z-shaped support plate 6 and a bottom plate 5 connected sequentially from top to bottom, wherein the Z-shaped support plate 6 has a Z-shaped cross-sectional shape in a horizontal direction, the beam 1 is installed inside the bearing ring 7, the flat plate 1d of the beam 1 is facing the solar module, and the bottom plate 5 is connected to the post 3. Wherein, when compared with the support structure with a C-shaped cross section in the prior art, the Z-shaped support plate 6 is stressed more evenly, so that the load capacity of the Z-shaped support plate 6 is improved.

More preferably, as shown in FIGS. 3 and 8-10, in order to make position and angle adjustment of the beam 1, the present example also includes a post top column including a horizontally arranged first connecting plate 4a, wherein both ends of the first connecting plate 4a extend towards the post 3 to form a second connecting plate 4b, the second connecting plate 4b is connected to the post 3. In the present example, both ends of the first connecting plate 4a extend downwards to form the second connecting plate 4b, that is to say, the second connecting plate 4b is vertically arranged.

Figure 9:
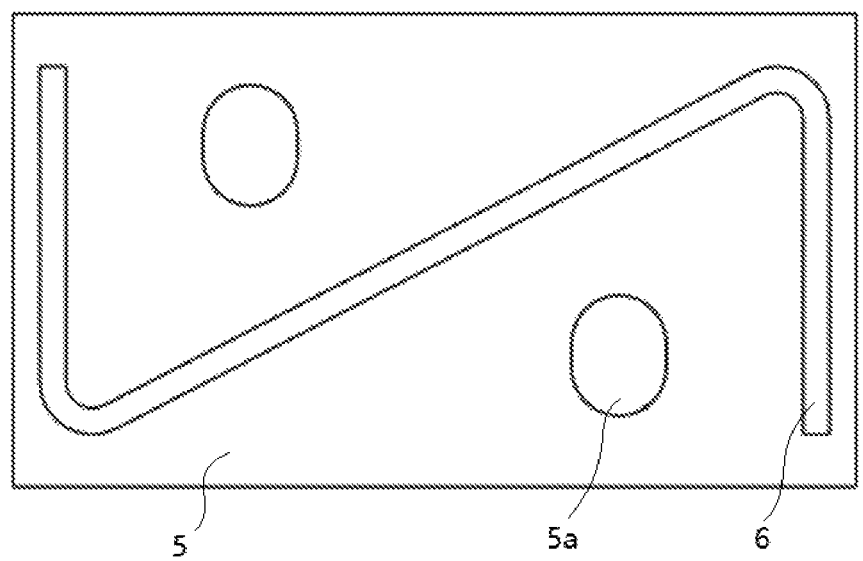
FIG. 9 is a top view of a bottom plate and a Z-shaped support plate.
Figure 10:
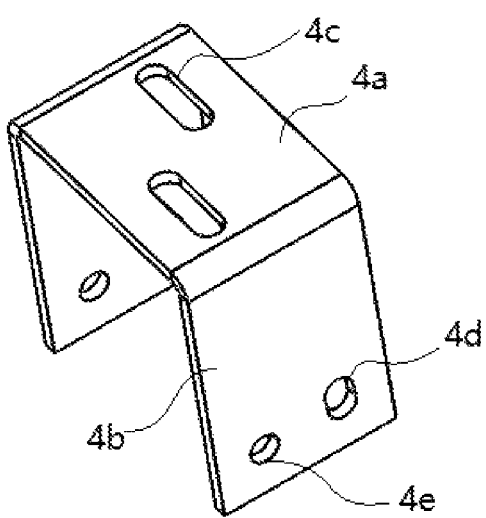
FIG. 10 is a perspective view of a post top column.

As shown in FIG. 10, the first connecting plate 4a is perforated with two first horizontal adjustment waist holes 4c symmetrical about the center of the first connecting plate 4a, and the centers of the two first horizontal adjustment waist holes 4c are on the same diagonal line. As shown in FIGS. 8-9, the bottom plate 5 is provided with two second horizontal adjustment waist holes 5a symmetrical about the center of the bottom plate 5 and corresponding to the first horizontal adjustment waist holes 4c, and the centers of the two second horizontal adjustment waist holes 5a are on the same diagonal line. The two second horizontal adjustment waist holes 5a are respectively located on both sides of the Z-shaped support plate. The first horizontal adjustment waist hole 4c and the second horizontal adjustment waist hole 5a are locked via a bolt.

As shown in FIGS. 8-10, the long axis of the first horizontal adjustment waist hole 4c and the long axis of the second horizontal adjustment waist hole 5a are perpendicular to each other. The long axis of the first horizontal adjustment waist hole 4c is perpendicular to the extension direction of the beam 1, and the long axis of the second horizontal adjustment waist hole 5a is parallel to the extension direction of the beam 1.

When adjusting the horizontal position of the beam 1, first loosen the bolts that lock the first horizontal adjustment waist holes 4c and the second horizontal adjustment waist holes 5a, move the beam 1 to a suitable position, and then tighten the bolts to make the bottom plate 5 fixed to the first connecting plate 4a of the post top column.

When adjusting the angle of the beam 1 in the horizontal direction, first loosen the bolts that lock the first horizontal adjustment waist holes 4c and the second horizontal adjustment waist holes 5a, rotate the beam 1 with the center of the bottom plate 5 as the center of rotation. After adjusting the beam 1 to a proper angle, tighten the bolts to fix the bottom plate 5 to the first connecting plate 4a of the post top column. Of course, the beam 1 can be adjusted first in terms of position in the horizontal direction, and then in terms of angle in the horizontal direction. The adjustment method is the same as above.

In other specific examples, the long axis of the first horizontal adjustment waist hole 4c can also be parallel to the extension direction of the beam 1, and the long axis of the second horizontal adjustment waist hole 5a is perpendicular to the extension direction of the beam 1, which will not be repeated herein.

Figure 3:
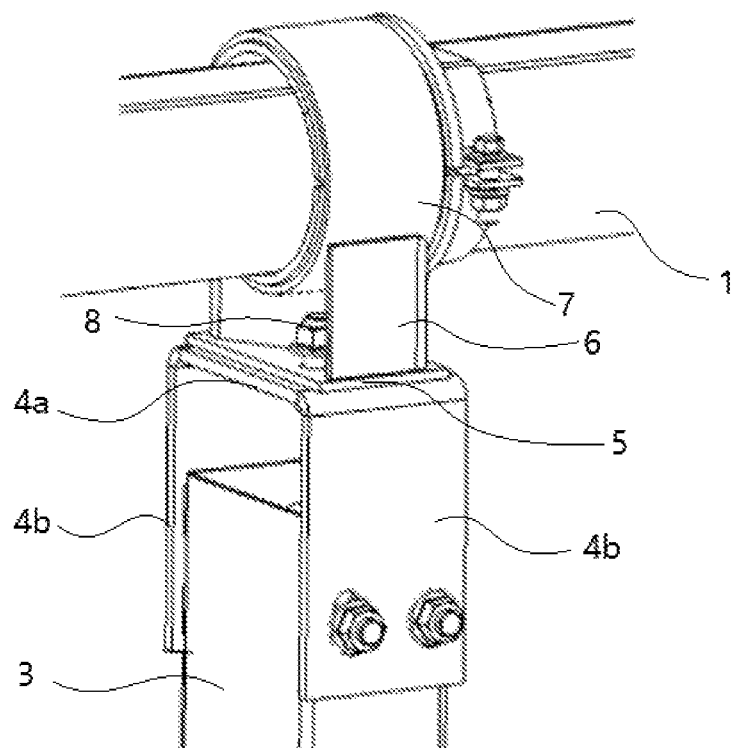
FIG. 3 is a perspective view of a solar tracking bracket.

In order to make angle adjustment of the post top column in the height direction, as shown in FIGS. 3 and 10, each second connecting plate 4b is perforated with a vertical adjustment waist hole 4d and a vertical fixing hole 4e, that is to say, in the present example, both of the two second connecting plates 4b are perforated with a vertical adjustment waist hole 4d and a vertical fixing hole 4e. The post 3 is perforated with a post adjustment waist hole corresponding to the vertical adjustment waist hole 4d, and the column 3 is perforated with a post fixing hole corresponding to the vertical fixing hole 4e, that is to say, a post adjustment waist hole and a post fixing hole are perforated on both side walls of the column 3. The long axis of the vertical adjustment waist hole 4d is perpendicular to the long axis of the post adjustment waist hole. As shown in FIG. 10, the long axis of the vertical adjustment waist hole 4d is parallel to the vertical direction. The post adjustment waist hole and the vertical adjustment waist hole 4d are fastened via a bolt, and the post fixing hole and the vertical fixing hole 4e are fastened via a bolt.

When it is necessary to adjust the angle of the beam 1 in the height direction via the post top column, loosen the bolt connecting the post adjustment waist hole and the vertical adjustment waist hole 4d, then adjust the beam 1 in the height direction to a proper angle, and last tighten the bolts.

Of course, the long axis of the vertical adjustment waist hole 4d can also be perpendicular to the vertical direction, and the long axis of the post adjustment waist hole can be parallel to the vertical direction, which can also achieve the purpose of adjusting the angle of the beam 1 in the height direction.

Figure 4:
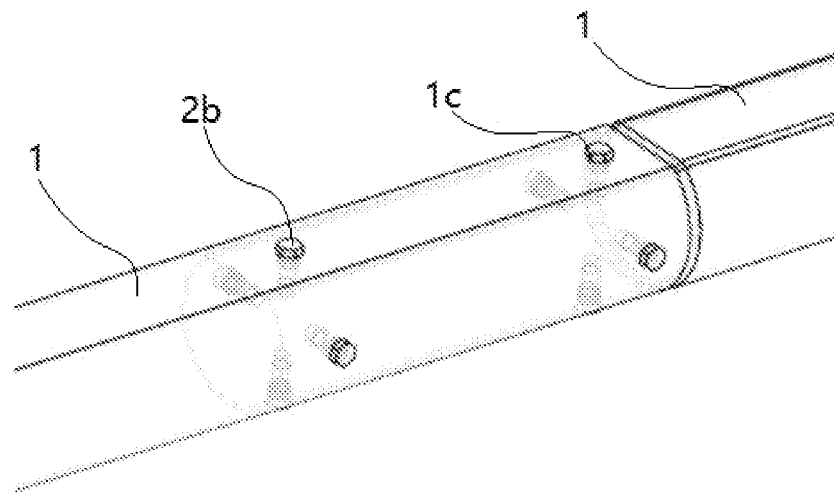
FIG. 4 is a view showing connection of adjacent beams.
Figure 5:
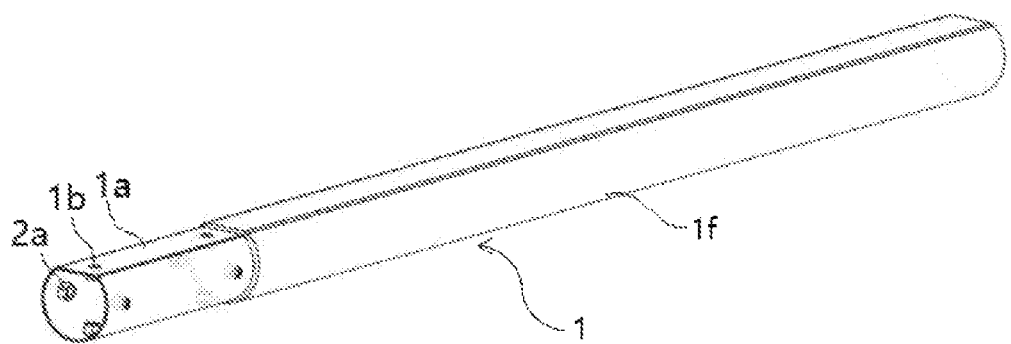
FIG. 5 is a perspective view of a shrinkable section of a beam.
Figure 6:
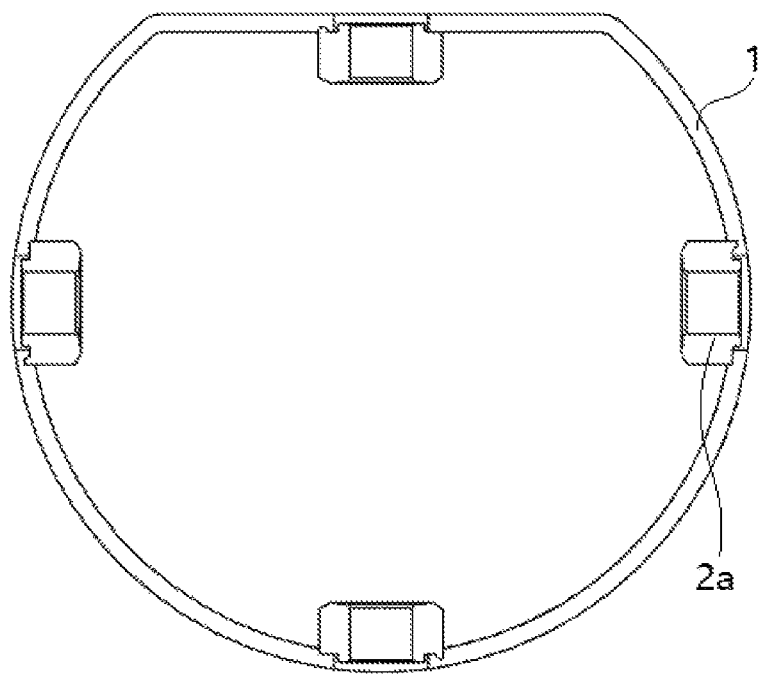
FIG. 6 is a structural view of a shrinkable section of a first beam.

As shown in FIGS. 4-6, a first end of the beam 1 is a shrinkable section 1a, the shrinkable section 1a is formed by extruding the first end of the beam 1 (the left end of the beam 1 in FIG. 5). The shrinkable section 1a is perforated with 8 first connecting holes 1b. The 8 first connecting holes 1b are divided into two groups, wherein 4 first connecting holes 1b in each group of the first connecting holes 1b are evenly circumferentially arranged on the shrinkable section 1a. The two groups of the first connecting holes 1b are arranged along the axial direction of the beam 1. As shown in FIG. 6, a locking nut 2a is welded to each first connecting hole 1b on the inner surface of the shrinkable section 1a. As shown in FIG. 4, a second end of the beam 1 (the right end of the beam 1 in FIG. 5) is perforated with a second connecting hole 1c corresponding to the first connecting hole 1b of the shrinkable section 1a, that is to say, the second end of the beam 1 is perforated with 8 second connecting holes 1c. When adjacent beams 1 are connected, the shrinkable section 1a of the beam 1 extends into the second end of the adjacent beam 1, a locking bolt 2b sequentially passes through the second connecting hole 1c of the second end of the adjacent beam 1 and the first connecting hole 1b of the shrinkable section 1a of the beam 1 and is fastened by screwing to a locking nut 2a at the first connecting hole 1b. That is to say, in the present example, 8 locking bolts 2b are needed to connect the adjacent beams 1.

In other specific examples, the numbers of the first connecting hole 1b, the second connecting hole 1c, the locking nut 2a and the locking bolts 2b are not limited to the present example, but may be other numbers. The first connecting hole 1b may not be arranged on the shrinkable section 1a, but may be arranged at any position of the shrinkable section 1a, as long as the first connecting hole 1b and the second connecting hole 1c can be connected via the locking nut 2a and the locking bolt 2b, which is not limited herein.

Example 7

Figure 7:
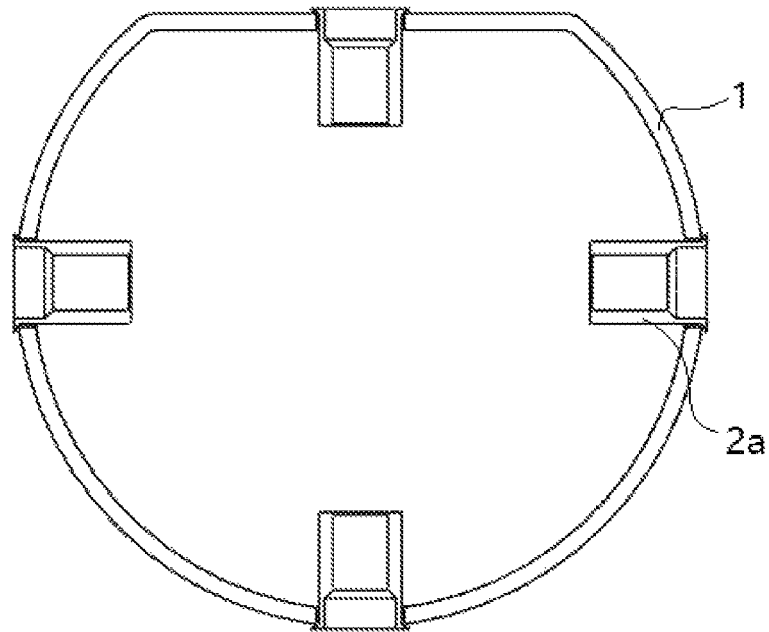
FIG. 7 is a structural view of a shrinkable section of a second beam.

As shown in FIG. 7, the structures of example 7 and example 6 are substantially the same. The difference between example 7 and example 6 is that the lock nut 2a of example 7 is riveted on the inner surface of the shrinkable section 1a.

It should be noted that the above examples can be freely combined as required. The above are merely preferred embodiments of the present invention. It should be pointed out that for those of ordinary skill in the art, several improvements and modifications can be made without departing from the principle of the present invention, and these improvements and modifications should be regarded as the protection scope of the present invention.

What is claimed is:

1. A beam, comprising:
   a flat plate and a curved plate, each of both ends of the flat plate being respectively fixedly connected to a corresponding end of the curved plate, the beam forming a ring shape, and a length L1 of the curved plate in cross section is greater than or equal to 76% of a circumference L2 of the beam in cross section;
   wherein, the curved plate is an elliptical curved plate, and a plane where the flat plate is located is perpendicular to a long axis of an ellipse where the elliptical curved plate is located.

2. The beam according to claim 1, wherein the flat plate comprises a main plate and two lateral plates located on both sides of the main plate, two side ends of the main plate are respectively connected to the two lateral plates, the two lateral plates are perpendicular to the main plate, two free ends of the curved plate are respectively and correspondingly connected to the two lateral plates, and a length of the main plate in cross section is smaller than a maximum chord length of the curved plate in cross section.

3. A solar tracking bracket with the beam as defined in claim 1, further comprising:
   a post; and
   a bearing seat comprising a bearing ring, a Z-shaped support plate and a bottom plate connected sequentially from top to bottom, the Z-shaped support plate having a Z-shaped cross section in a horizontal direction, the beam being installed inside the bearing ring, the flat plate of the beam facing the solar module, and the bottom plate being connected to the post.

4. The solar tracking bracket according to claim 3, further comprising:
a post top column comprising a first connecting plate, wherein both ends of the first connecting plate extend towards the post to form a second connecting plate, the second connecting plate is connected to the post, the first connecting plate is perforated with a first horizontal adjustment waist hole, the bottom plate is perforated with a second horizontal adjustment waist hole corresponding to the first horizontal adjustment waist hole, the first horizontal adjustment waist hole and the second horizontal adjustment waist hole are locked via a bolt, a long axis of the first horizontal adjustment waist hole and a long axis of the second horizontal adjustment waist hole are perpendicular to each other, and the long axis of the first horizontal adjustment waist hole is parallel to an extension direction of the beam, or the long axis of the first horizontal adjustment waist hole is perpendicular to the extension direction of the beam.

5. The solar tracking bracket according to claim 4, wherein two of the first horizontal adjustment waist holes are provided and symmetrical about a center of the first connecting plate, two of the second horizontal adjustment waist holes are provided and symmetrical about a center of the bottom plate.

6. The solar tracking bracket according to claim 4, wherein each of the second connecting plates is provided with a vertical adjustment waist hole and a vertical fixing hole, the post is provided with a post adjustment waist hole corresponding to the vertical adjustment waist hole, the post is provided with a post fixing hole corresponding to the vertical fixing hole, a long axis of the vertical adjustment waist hole and a long axis of the post adjustment waist hole are perpendicular to each other, the post adjustment waist hole and the vertical adjustment waist hole are fastened via a bolt, the post fixing hole and the vertical fixing hole are fastened via a bolt.

7. The solar tracking bracket according to claim 3, wherein
a first end of the beam is a shrinkable section formed by extruding the first end of the beam, an inner surface of the shrinkable section is welded or riveted with a locking nut;
the shrinkable section of the beam extends into a second end of an adjacent beam, a locking bolt sequentially passes through the second end of the adjacent beam and the shrinkable section of the beam and is fastened by screwing to a corresponding locking nut.

8. The solar tracking bracket according to claim 7, wherein a plurality of locking nuts are provided and are evenly arranged on the inner surface of the shrinkable section of the beam, the locking nuts and the locking bolts are provided in one-to-one correspondence.

9. A beam, wherein the beam comprises a flat plate and a curved plate, the flat plate comprises a main plate and two lateral plates located on both sides of the main plate, two side ends of the main plate are respectively connected to the two lateral plates, the two lateral plates are perpendicular to the main plate, the curved plate is located on an opposite side to the flat plate, two free ends of the curved plate are respectively and correspondingly connected to the two lateral plates, such that the beam forms a circumferentially enclosed piping component; the beam has a rotation center, and two connecting lines between the two free ends of the curved plate and the rotation center form an included angle A, where 120 degrees≤A≤180 degrees;
wherein, the curved plate is an elliptical curved plate, and a plane where the flat plate is located is perpendicular to a long axis of an ellipse where the elliptical curved plate is located.

10. The beam according to claim 9, wherein the length of the main plate in cross section is equal to the maximum chord length of the curved plate in cross section.

11. A solar tracking bracket with the beam as defined in claim 9, further comprising:
a post; and
a bearing seat comprising a bearing ring, a Z-shaped support plate and a bottom plate connected sequentially from top to bottom, the Z-shaped support plate having a Z-shaped cross section in a horizontal direction, the beam being installed inside the bearing ring, the flat plate of the beam facing the solar module, and the bottom plate being connected to the post.

12. The solar tracking bracket according to claim 11, further comprising:
a post top column comprising a first connecting plate, wherein both ends of the first connecting plate extend towards the post to form a second connecting plate, the second connecting plate is connected to the post, the first connecting plate is perforated with a first horizontal adjustment waist hole, the bottom plate is perforated with a second horizontal adjustment waist hole corresponding to the first horizontal adjustment waist hole, the first horizontal adjustment waist hole and the second horizontal adjustment waist hole are locked via a bolt, a long axis of the first horizontal adjustment waist hole and a long axis of the second horizontal adjustment waist hole are perpendicular to each other, and the long axis of the first horizontal adjustment waist hole is parallel to an extension direction of the beam, or the long axis of the first horizontal adjustment waist hole is perpendicular to the extension direction of the beam.

13. The solar tracking bracket according to claim 12, wherein two of the first horizontal adjustment waist holes are provided and symmetrical about a center of the first connecting plate, two of the second horizontal adjustment waist holes are provided and symmetrical about a center of the bottom plate.

14. The solar tracking bracket according to claim 12, wherein each of the second connecting plates is provided with a vertical adjustment waist hole and a vertical fixing hole, the post is provided with a post adjustment waist hole corresponding to the vertical adjustment waist hole, the post is provided with a post fixing hole corresponding to the vertical fixing hole, a long axis of the vertical adjustment waist hole and a long axis of the post adjustment waist hole are perpendicular to each other, the post adjustment waist hole and the vertical adjustment waist hole are fastened via a bolt, the post fixing hole and the vertical fixing hole are fastened via a bolt.

15. The solar tracking bracket according to claim 11, wherein
a first end of the beam is a shrinkable section formed by extruding the first end of the beam, an inner surface of the shrinkable section is welded or riveted with a locking nut;
the shrinkable section of the beam extends into a second end of an adjacent beam, a locking bolt sequentially passes through the second end of the adjacent beam and the shrinkable section of the beam and is fastened by screwing to a corresponding locking nut.

16. The solar tracking bracket according to claim 15, wherein
    a plurality of locking nuts are provided and are evenly arranged on the inner surface of the shrinkable section of the beam, the locking nuts and the locking bolts are provided in one-to-one correspondence.

\* \* \* \* \*